(12) United States Patent
Kadowaki

(10) Patent No.: US 11,921,951 B2
(45) Date of Patent: Mar. 5, 2024

(54) TOUCH SENSOR

(71) Applicant: Wacom Co., Ltd., Saitama (JP)

(72) Inventor: Jun Kadowaki, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 17/892,802

(22) Filed: Aug. 22, 2022

(65) Prior Publication Data

US 2022/0391068 A1 Dec. 8, 2022

Related U.S. Application Data

(63) Continuation of application No. PCT/JP2021/005794, filed on Feb. 17, 2021.

(60) Provisional application No. 62/988,708, filed on Mar. 12, 2020.

(51) Int. Cl.
| | |
|---|---|
| G06F 3/041 | (2006.01) |
| G06F 3/044 | (2006.01) |
| H10K 50/822 | (2023.01) |
| H10K 59/131 | (2023.01) |
| H10K 59/35 | (2023.01) |
| H10K 59/40 | (2023.01) |

(52) U.S. Cl.
CPC ........ *G06F 3/04182* (2019.05); *G06F 3/0412* (2013.01); *G06F 3/0443* (2019.05); *H10K 50/822* (2023.02); *H10K 59/131* (2023.02); *H10K 59/35* (2023.02); *H10K 59/40* (2023.02)

(58) Field of Classification Search
CPC .... G06F 3/04182; G06F 3/0412; G06F 3/041; G06F 3/0443; G09G 3/3655; H10K 50/822; H10K 50/80521; H10K 50/824; H10K 59/40; H10K 59/35; H10K 59/131; H10K 59/12; H10K 59/80522
USPC .............................................. 345/174, 76, 87
See application file for complete search history.

(56) References Cited

U.S. PATENT DOCUMENTS

| | | | |
|---|---|---|---|
| 2004/0178719 A1* | 9/2004 | Sun ........................ | H10K 50/82 313/500 |
| 2011/0242050 A1 | 10/2011 | Byun et al. | |
| 2016/0195946 A1 | 7/2016 | Ahn et al. | |
| 2020/0210006 A1* | 7/2020 | Son ........................ | H10K 59/12 |
| 2020/0257429 A1 | 8/2020 | Hisano | |
| 2021/0149259 A1 | 5/2021 | Onaka et al. | |

FOREIGN PATENT DOCUMENTS

| | | |
|---|---|---|
| JP | 2009-244528 A | 10/2009 |
| JP | 2011-222013 A | 11/2011 |

(Continued)

OTHER PUBLICATIONS

International Search Report, dated May 11, 2021, for International Application No. PCT/JP2021/005794, 4 pages.

*Primary Examiner* — Jimmy H Nguyen
(74) *Attorney, Agent, or Firm* — Seed IP Law Group LLP

(57) ABSTRACT

A touch sensor includes a display panel that includes a plurality of pixel electrodes each provided in a corresponding one of a plurality of pixels, and a common electrode shared by the plurality of pixels. The touch sensor also includes a touch panel that detects a position of at least either a finger or a pen. The display panel and the touch panel are superimposed on each other in a vertical direction. The common electrode includes a conductor-area-reduction portion that reduces an area of the common electrode.

9 Claims, 13 Drawing Sheets

(56) References Cited

FOREIGN PATENT DOCUMENTS

WO  2019/087332 A1  5/2019
WO  2020/003364 A1  1/2020

* cited by examiner

TOUCH SENSOR

BACKGROUND

Technical Field

The present disclosure relates to a touch sensor having a structure in which a display panel and a touch panel are superimposed on each other in the vertical direction.

Description of the Related Art

There are known touch sensors that have a structure in which a touch panel for detecting the position of a finger or a pen is provided on a display panel. Among this type of touch sensors, a touch sensor in which a display panel and a touch panel are integrally formed is called an "on-cell type," while a touch sensor in which a display panel and a touch panel are formed separately from each other is called an "out-cell type." Hereinafter, a touch sensor of the "on-cell type" and a touch sensor of the "out-cell type" will collectively be referred to as a "touch sensor."

In the touch sensor, apart from the parasitic capacitance generated between sensor electrodes in the touch panel, parasitic capacitance is also generated between the touch panel and the display panel. Hereinafter, the latter parasitic capacitance will be referred to as "vertical-direction parasitic capacitance." A display driving signal supplied from a computer to the display panel also reaches the touch panel through this vertical-direction parasitic capacitance. The display driving signal that has reached the touch panel in this way becomes noise for the operation of the touch panel, deteriorating the detection accuracy of a finger or a pen.

PCT Patent Publication No. WO 2019/087332 (hereinafter referred to as "Patent Document 1") and Japanese Patent Laid-Open No. 2011-222013 (hereinafter referred to as "Patent Document 2") disclose techniques for mitigating such deterioration of the detection accuracy. Specifically, Patent Document 1 discloses a technique for reducing the noise by using the display-side processing, which changes a method of driving a plurality of pixel electrodes depending on the content of image data and on the polarity of each pixel electrode. Patent Document 2 discloses a technique for reducing the influence of the noise by applying the amount of charge corresponding to the vertical-direction parasitic capacitance to a charge amplifier of a touch sensor.

With the techniques described in Patent Documents 1 and 2, the noise can be reduced, but the vertical-direction parasitic capacitance itself cannot be reduced. In order to detect the position of a finger or a pen without being affected by the display as much as possible, it is preferable to reduce the vertical-direction parasitic capacitance itself.

BRIEF SUMMARY

Therefore, it is desirable to provide a touch sensor that can reduce the vertical-direction parasitic capacitance itself.

A touch sensor according to one aspect of the present disclosure includes a display panel that includes a plurality of pixel electrodes each provided in a corresponding one of a plurality of pixels and a common electrode shared by the plurality of pixels, and a touch panel that detects a position of at least either a finger or a pen. The display panel and the touch panel are superimposed on each other in a vertical direction. The common electrode includes a conductor-area-reduction portion that reduces an area of the common electrode.

Accordingly, it is possible to reduce the area of the common electrode that essentially constitutes one of the electrodes of the vertical-direction capacitance, so that the vertical-direction parasitic capacitance itself can be reduced.

BRIEF DESCRIPTION OF THE SEVERAL VIEWS OF THE DRAWINGS

FIG. 4A is a cross-sectional view of the display panel taken along line A-A illustrated in FIG. 2, while

FIG. 7A is a cross-sectional view of the display panel taken along line C-C illustrated in FIG. 6, while

FIG. 12A is a cross-sectional view of the display panel taken along line E-E illustrated in FIG. 11, while

DETAILED DESCRIPTION

Hereinafter, embodiments of the present disclosure will be described in detail with reference to the accompanying drawings.

Figure 1:
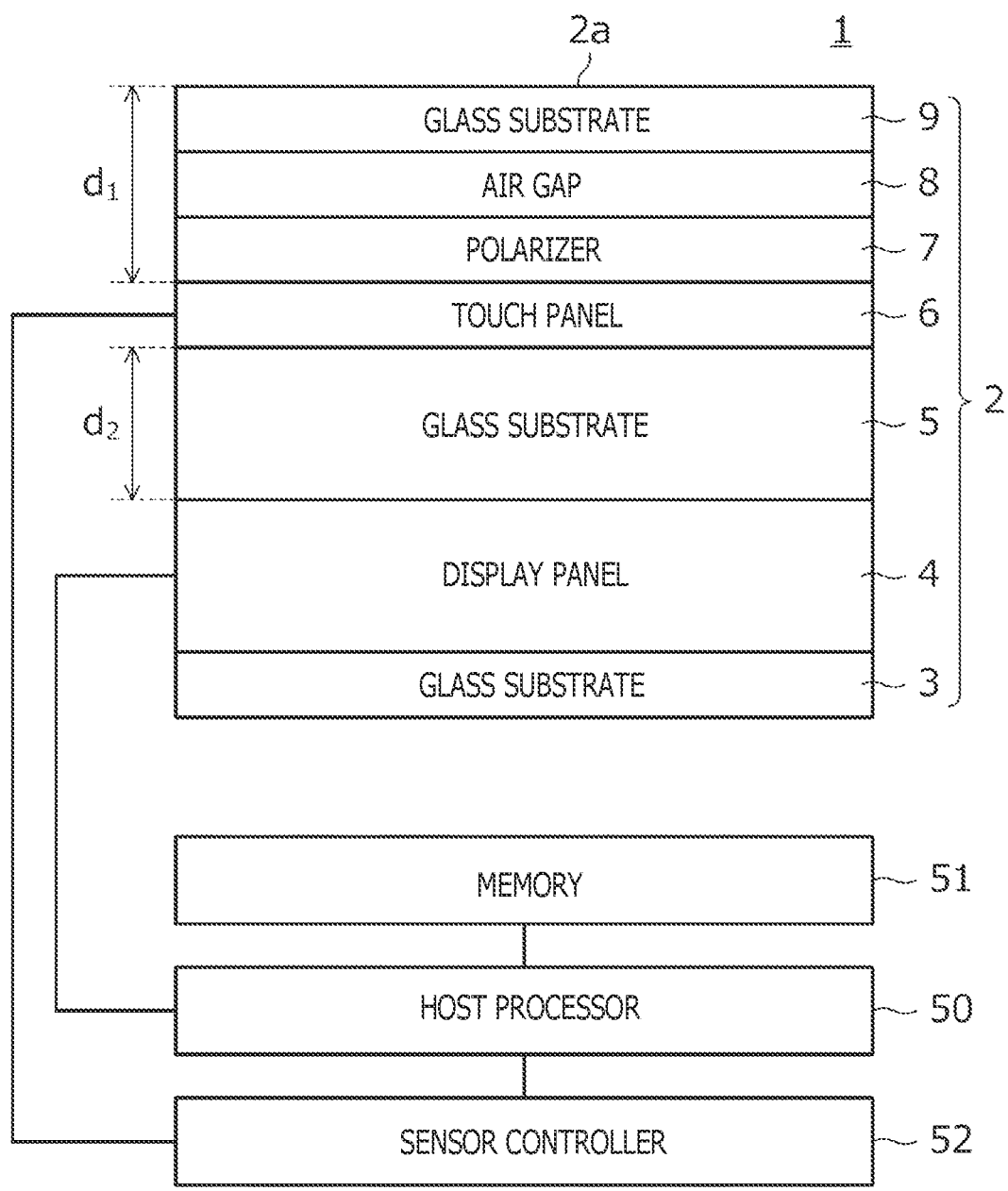
FIG. 1 is a diagram illustrating a configuration of an electronic device including a touch sensor according to a first embodiment of the present disclosure.

FIG. 1 is a diagram illustrating a configuration of an electronic device 1 including a touch sensor 2 according to the present embodiment. An upper side of FIG. 1 represents a vertical cross-sectional view of the touch sensor 2, depicting the panel structure thereof. The electronic device 1 is a personal information device such as a tablet terminal, a smartphone, or a laptop computer, and includes a host processor 50, a memory 51, and a sensor controller 52 in addition to the touch sensor 2.

The host processor 50 is a central processing unit of the electronic device 1. Further, the memory 51 is a storage device capable of storing any data and includes a main storage device such as a dynamic random access memory (DRAM) and an auxiliary storage device such as a hard disk. The host processor 50 can execute various applications including an operating system of the electronic device 1 and a drawing application by reading and executing programs stored in the memory 51. The memory 51 functions as a work memory of the host processor 50 and also stores data generated by the host processor 50.

The sensor controller 52 is an integrated circuit that detects the positions of a finger and a pen on a touch surface 2a, which will be described later, by using a touch panel 6. Details of the processing performed by the sensor controller 52 will be described later. Although the method of detecting the positions of the finger and the pen is not limited to a particular one, the finger position detection is, for example, performed by using a capacitance method, and the pen position detection is, for example, performed by using an active capacitive method or an electromagnetic induction method. The following description assumes that the finger position detection is performed by using the capacitance method and the pen position detection is performed by using the active capacitive method.

The touch sensor 2 is a touch sensor classified into the above-described on-cell type and has a structure in which a display panel 4 and the touch panel 6 are integrally formed. More specifically, as illustrated in FIG. 1, the touch sensor 2 has a structure in which a glass substrate 3 (bottom glass), the display panel 4, a glass substrate 5 (top glass), the touch panel 6, a polarizer 7, an air gap 8, and a glass substrate 9 (window glass) are stacked in this order. The front surface of the glass substrate 9 constitutes the touch surface 2a on which a user slides a finger or a pen. In the following description, "the upper side of the touch sensor 2" refers to the touch surface 2a side, while "the lower side of the touch sensor 2" refers to the side opposite to that of the touch surface 2a (the front surface of the glass substrate 3).

The display panel 4 is an organic electroluminescence (EL) display provided on the glass substrate 3 and has a structure in which a plurality of OLED cells, each of which constitutes a pixel (sub-pixel), are arranged in a matrix. The structure of the display panel 4 will be described in more detail later. The display panel 4 individually drives each OLED cell according to a display driving signal supplied from the host processor 50, thereby displaying an image generated by the host processor 50.

The touch panel 6 is a sensor for detecting the position of at least one of a finger and a pen and is provided on the upper surface of the display panel 4 (more specifically, on the upper surface of a common electrode 32 to be described later) with the glass substrate 5 interposed between the touch panel 6 and the display panel 4. The glass substrate 5 is a transparent insulator having a predetermined permittivity ε and a thickness $d_2$. The specific value of the thickness $d_2$ is, for example, a value smaller than several tens of μm.

A plurality of sensor electrodes (not illustrated) each connected to the sensor controller 52 are arranged in the touch panel 6. The plurality of sensor electrodes include a plurality of first linear conductors (not illustrated) and a plurality of second linear conductors (not illustrated). The plurality of first linear conductors extend parallel to one side of the touch panel 6, which has a rectangular shape, and are arranged at equal intervals. The plurality of second linear conductors extend in the direction orthogonal to the above-described one side of the touch panel 6 and are arranged at equal intervals. Both the first and second linear conductors include transparent conductors such as indium tin oxide (ITO).

The sensor controller 52 performs bidirectional communication with a pen by using the plurality of sensor electrodes included in the touch panel 6, to perform a process of detecting the position of the pen as well as a process of receiving data transmitted from the pen. Further, the sensor controller 52 performs a process of detecting the position of a finger by supplying a finger detection signal to each of the plurality of first linear conductors and receiving the finger detection signal through each of the plurality of second linear conductors. The sensor controller 52 sequentially supplies the position of the pen or the finger detected in this way and the data received from the pen to the host processor 50. The host processor 50 performs a process of generating an image based on the position and data supplied in this way and then supplying a display driving signal for displaying the generated image to the display panel 4. The image generated by the host processor 50 includes a cursor displayed at the position corresponding to the position of the finger or the pen, stroke data indicating the trajectory of the position of the finger or the pen, and the like.

The polarizer 7 is for improving the outdoor visibility of the display panel 4 and is provided on the upper surface of the touch panel 6. The glass substrate 9 is a flat and transparent insulator and is provided on the polarizer 7 with the air gap 8 interposed therebetween. A resin layer may be used in place of or together with the air gap 8. A distance $d_1$ between the touch panel 6 and the touch surface 2a corresponds to the total thickness of the polarizer 7, the air gap 8, and the glass substrate 9. The larger the distance $d_1$, the larger the distance between the plurality of sensor electrodes included in the touch panel 6 and a finger or a pen, deteriorating the accuracy of the position detection by the sensor controller 52. Therefore, it is preferable that the distance $d_1$ be as small as possible.

Here, in addition to the distance $d_1$, the thickness $d_2$ of the glass substrate 5 described above also affects the accuracy of the position detection by the sensor controller 52. Specifically, the display driving signal that has leaked from the display panel 4 reaches the touch panel 6 through the above-described vertical-direction parasitic capacitance (parasitic capacitance generated between the touch panel 6 and the display panel 4). Since the display driving signal reaching the touch panel 6 is superimposed as noise on signals transmitted/received between the sensor controller 52 and the pen and on the finger detection signal described above, it is preferable to reduce the intensity of the display driving signal reaching the touch panel 6 as much as possible. For this purpose, it is preferable to increase the thickness $d_2$ and reduce the vertical-direction parasitic capacitance. However, for the purpose of height reduction of the touch sensor 2 or increasing the visibility of the display panel 4, it is preferable to reduce the thickness $d_2$ and, therefore, the actual thickness $d_2$ tends to be decreasing. As the thickness $d_2$ becomes smaller, the above-described distance $d_1$ becomes relatively large, resulting in the deterioration of the accuracy of the position detection by the sensor controller 52. Therefore, there is a need for a technique that can make the vertical-direction parasitic capacitance smaller by using a method other than the method of increasing the thickness $d_2$.

The present disclosure devises a structure inside the display panel 4 to realize the reduction of the vertical-direction parasitic capacitance by using a method other than the method of increasing the thickness $d_2$. The structure of the display panel 4 which realizes the reduction of the vertical-direction parasitic capacitance regardless of the thickness $d_2$ will specifically be described with reference to FIGS. 2 to 5.

Figure 2:
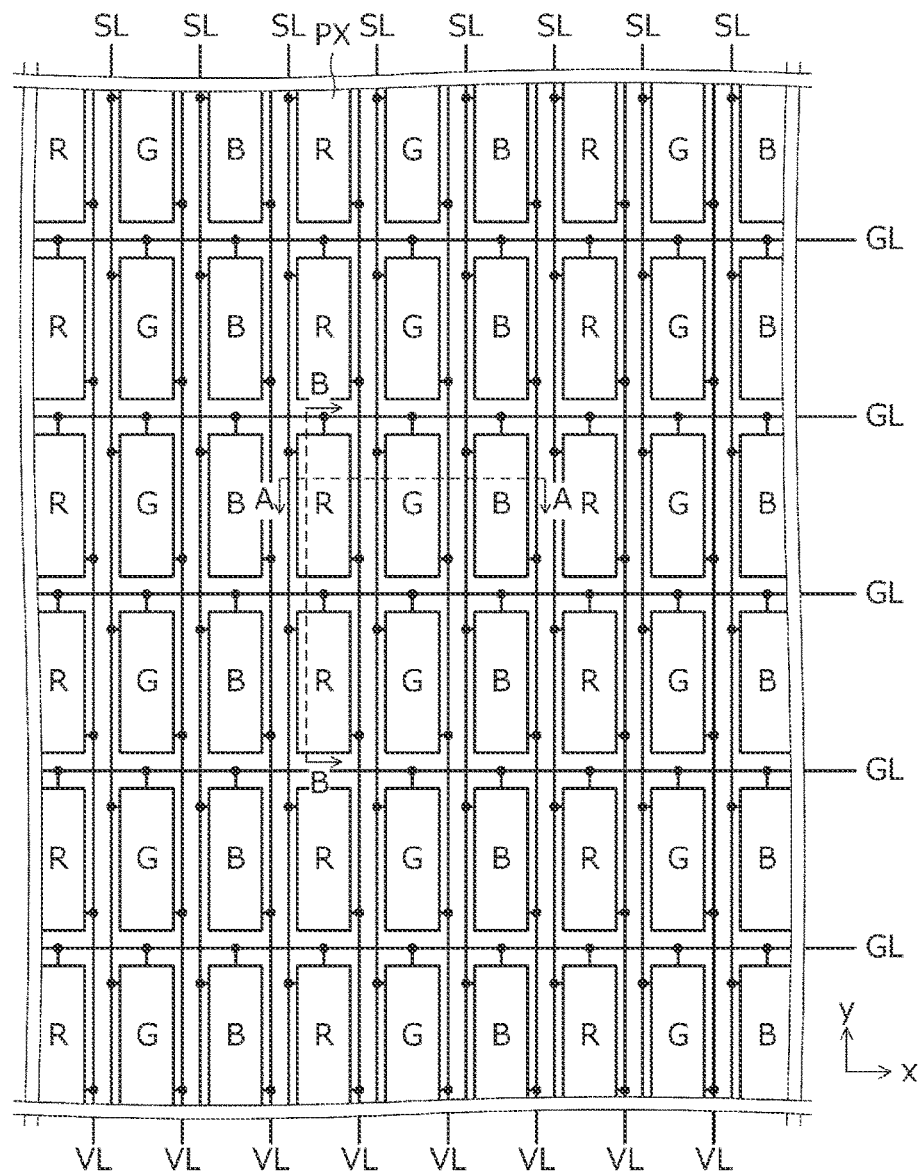
FIG. 2 is a plan view of a display panel illustrated in FIG. 1.

FIG. 2 is a plan view of the display panel 4. As illustrated in FIG. 2, the display panel 4 has a configuration in which a plurality of OLED cells PX (pixels) are arranged in a matrix along the x-direction and the y-direction illustrated in FIG. 2. Note that the region (rectangular region) of each OLED cell PX illustrated in FIG. 2 represents the range of light emission.

In FIG. 2 and subsequent figures below, OLED cells PX marked with "R" are OLED cells PX configured to emit red light. OLED cells PX marked with "G" are OLED cells PX configured to emit green light. OLED cells PX marked with "B" are OLED cells PX configured to emit blue light. As illustrated in FIG. 2, in the x-direction, a set of three OLED cells PX corresponding to "R," "G," and "B" is repeatedly arranged in order from the left. Further, in the y-direction, the OLED cells PX of the same color are repeatedly arranged.

Further, the display panel 4 includes a plurality of gate lines GL, a plurality of source lines SL, and a plurality of power supply lines VL. Each gate line GL is shared by corresponding OLED cells PX arranged in the x-direction and is connected to each corresponding OLED cell PX. Further, each source line SL and each power supply line VL are shared by corresponding OLED cells PX arranged in the y-direction and are connected to each corresponding OLED cell PX.

Figure 3:
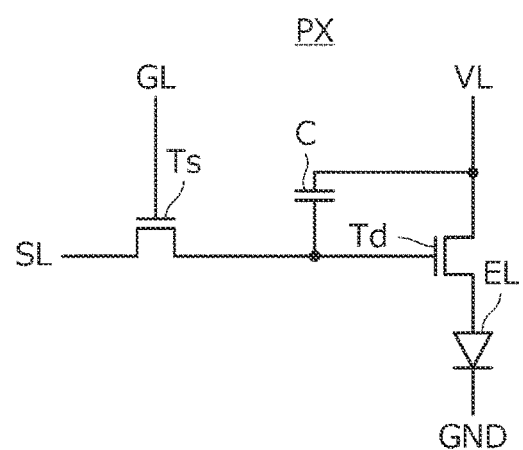
FIG. 3 is a diagram illustrating a circuit configuration of each organic light emitting diode (OLED) cell.

FIG. 3 is a diagram illustrating a circuit configuration of each OLED cell PX. As illustrated in FIG. 3, each OLED cell PX includes a switching transistor Ts, a driving transistor Td, an organic light emitting diode EL, and a capacitor C. A gate of the switching transistor Ts is connected to the corresponding gate line GL, while a source thereof is connected to the corresponding source line SL. Further, a source of the driving transistor Td is connected to the corresponding power supply line VL. A drain of the switching transistor Ts is connected to a gate of the driving transistor Td. The gate of the driving transistor Td is also connected to its own source via the capacitor C. An anode of the organic light emitting diode EL is connected to a drain of the driving transistor Td, while a cathode thereof is grounded.

The OLED cells PX are driven in units of rows in the matrix. Specifically, the host processor 50 first determines the emission intensity of each of the series of OLED cells PX arranged in the x-direction, according to an image to be displayed, and applies a potential corresponding to the determined emission intensity to each source line SL. Next, the corresponding gate line GL is activated to turn on the switching transistors Ts of the corresponding series of OLED cells PX. As a result, the potentials of the corresponding source lines SL are supplied to the gates of the corresponding driving transistors Td, thereby turning on these driving transistors Td. Each power supply line VL is connected to a power source having a predetermined voltage. When each of these driving transistors Td is turned on, the amount of current based on the potential of the corresponding source line SL is supplied to the corresponding organic light emitting diode EL. Accordingly, the organic light emitting diode EL emits light at the determined emission intensity.

Figure 4A:
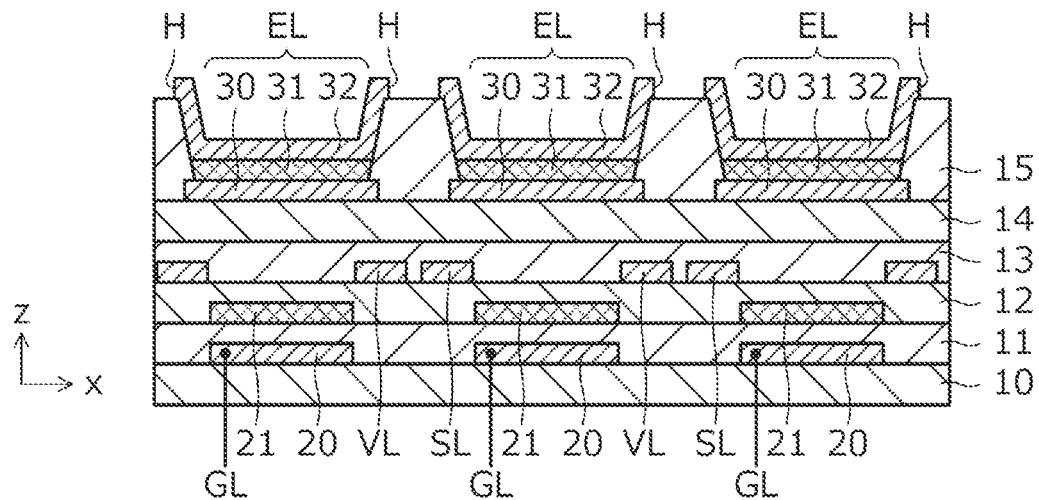
Figure 4B:
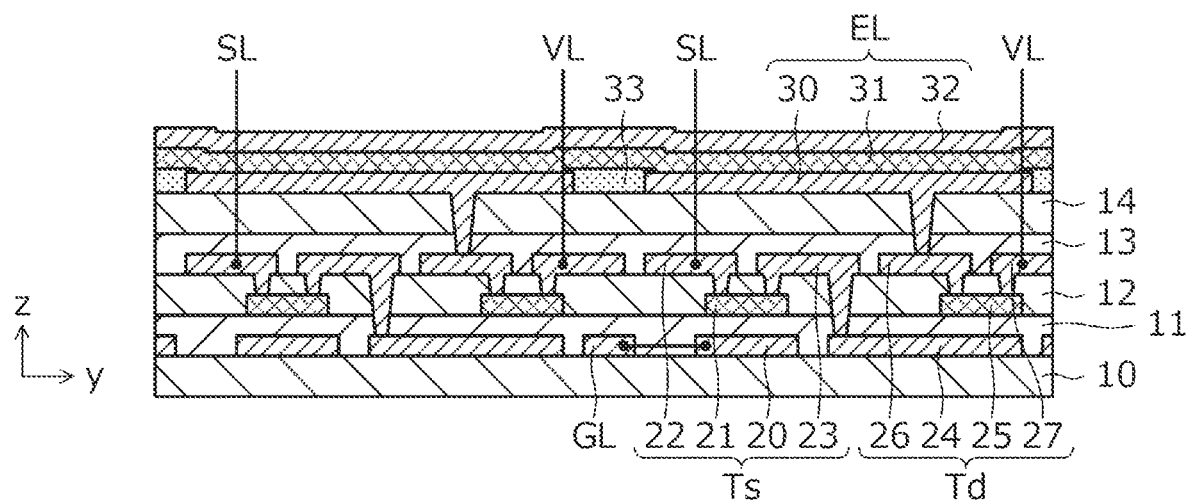
FIG. 4B is a cross-sectional view of the display panel taken along line B-B illustrated in FIG. 2.

FIG. 4A is a cross-sectional view of the display panel 4 taken along line A-A illustrated in FIG. 2. FIG. 4B is a cross-sectional view of the display panel 4 taken along line B-B illustrated in FIG. 2. Hereinafter, the layered structure of the display panel 4 will be described with reference to FIGS. 4A and 4B.

The display panel 4 includes six insulating layers 10 to 15 in order from the lower side. A gate 20 of the switching transistor Ts, a gate 24 of the driving transistor Td, and the gate line GL are formed on the upper surface of the insulating layer 10. The gate 20 and the gate line GL are connected to each other via a conductor (not illustrated in FIGS. 4A and 4B) formed on the upper surface of the insulating layer 10. Further, a channel 21 of the switching transistor Ts and a channel 25 of the driving transistor Td are formed on the upper surface of the insulating layer 11.

A source 22 and a drain 23 of the switching transistor Ts, a drain 26 and a source 27 of the driving transistor Td, the source line SL, and the power supply line VL are formed on the upper surface of the insulating layer 12. The source 22 is connected to one end of the channel 21 by a via conductor penetrating the insulating layer 12. Further, the drain 23 is connected to the other end of the channel 21 by a via conductor penetrating the insulating layer 12 and is also connected to the gate 24 by a via conductor penetrating the insulating layers 11 and 12. The drain 26 is connected to one end of the channel 25 by a via conductor penetrating the insulating layer 12. The source 27 is connected to the other end of the channel 25 by a via conductor penetrating the insulating layer 12. The capacitor C illustrated in FIG. 3 includes a parasitic capacitance formed between the source 27 and the gate 24.

A pixel electrode 30 which corresponds to the anode of the organic light emitting diode EL is formed on the upper surface of the insulating layer 14. The pixel electrode 30 is connected to the drain 26 by a via conductor penetrating the insulating layers 13 and 14. As illustrated in FIG. 4B, an insulating layer 33 is formed between two pixel electrodes 30 adjacent to each other in the y-direction. This secures insulation between two pixel electrodes 30 adjacent to each other in the y-direction. As illustrated in FIG. 4A, two pixel electrodes 30 adjacent to each other in the x-direction are insulated by the insulating layer 15.

The insulating layer 15 is formed thicker than the insulating layer 33. A region between two insulating layers 15 adjacent to each other in the x-direction has a valley-like structure having a bottom surface on which the pixel electrode 30 and the insulating layer 33 are alternately exposed. A light emitting layer 31 is formed with a constant thickness at the bottom of this valley. The light emitting layer 31 includes a material that emits light according to the potential difference between the corresponding pixel electrode 30 and the common electrode 32. Further, the common electrode 32, which corresponds to the cathode of the organic light emitting diode EL, is formed on the upper surface of the light emitting layer 31.

The common electrode 32 is formed on both the side surface of the valley formed by the insulating layer 15 and the upper surface of the insulating layer 15 and constitutes a rectangular solid conductor that covers the entire display panel 4 instead of covering each pixel. Accordingly, the common electrode 32 constitutes most of one of the electrodes of a vertical-direction capacitance. The reason why the common electrode 32 is formed as a solid conductor is to reduce the resistance of the common electrode 32 as much as possible. Although making one or more holes in the common electrode 32 would not be performed under normal circumstances, one or more holes H are formed in the common electrode 32 in the present embodiment. Each of the one or more holes H functions as a conductor-areareduction portion that reduces the area of the common electrode 32, and plays a role of reducing the area of the common electrode 32 as a whole. In the touch sensor 2 according to the present embodiment, one or more holes H are provided in the solid conductor in this way to reduce the area of the common electrode 32. Accordingly, the touch sensor 2 according to the present embodiment realizes the reduction of the vertical-direction parasitic capacitance.

Figure 5:
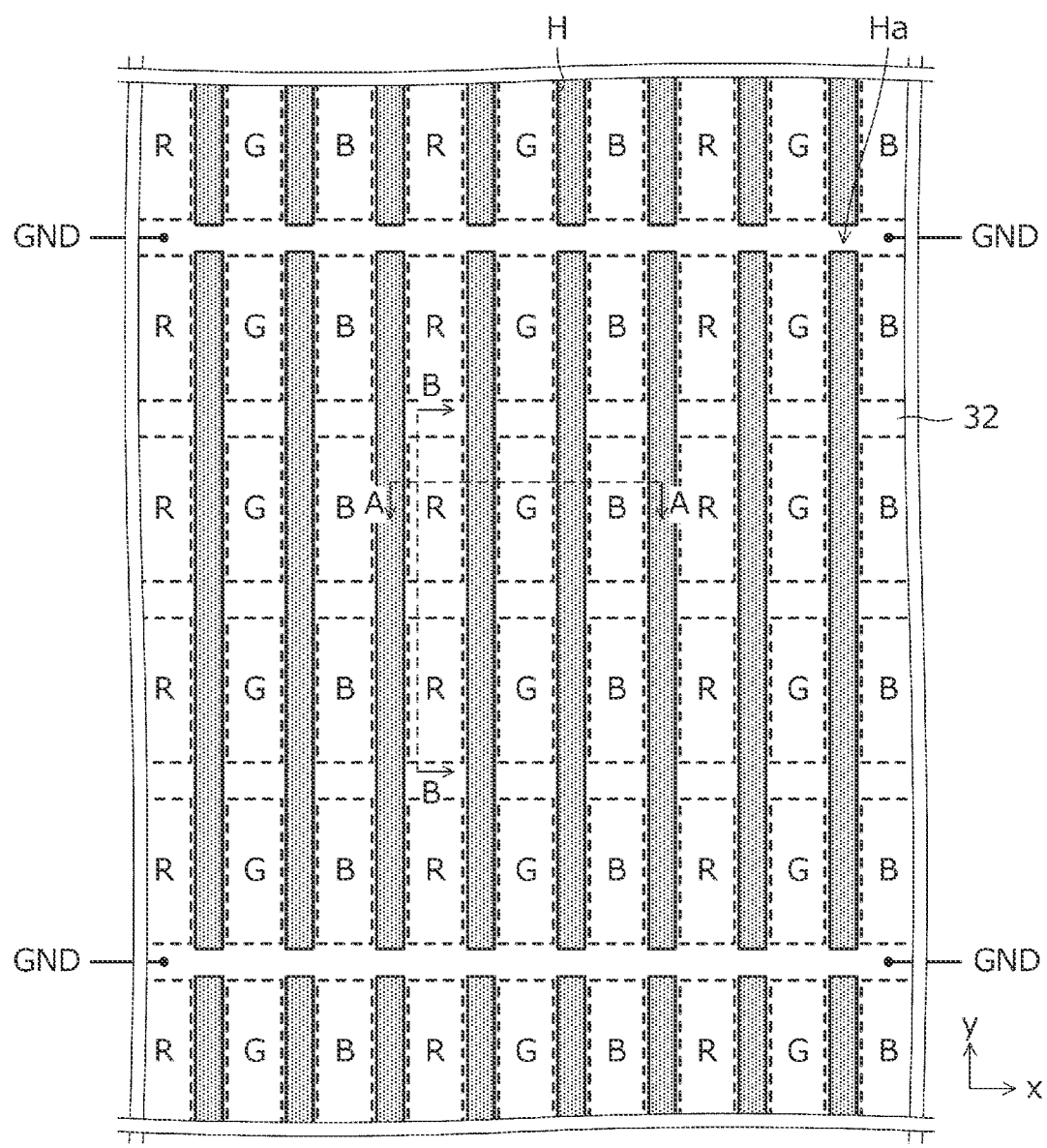
FIG. 5 is a view illustrating a planar configuration of a common electrode illustrated in FIGS. 4A and 4B.

FIG. 5 is a view illustrating a planar configuration of the common electrode 32. Each broken line illustrated in FIG. 5 represents the range of light emission of each pixel. As illustrated in FIG. 5, the common electrode 32 is connected to a constant voltage power supply to which a ground potential GND is supplied, by one or more power supply lines. In the example of FIG. 5, a total of four power supply lines, that is, two at one end of the display panel 4 in the x-direction and two at the other end thereof, are provided.

As illustrated in FIG. 5, each hole H of the common electrode 32 according to the present embodiment is formed in a region corresponding to a space between pixels as viewed in the horizontal direction. More specifically, the common electrode 32 includes a plurality of holes H, and each hole H is formed to extend in the y-direction in a corresponding one of a plurality of regions. Each of the plurality of regions corresponds to a space between two pixels adjacent to each other in the x-direction. However, several bridges Ha (portions where the holes H are not formed) are also provided in each of the plurality of regions each corresponding to a space between two pixels adjacent to each other in the x-direction. Accordingly, portions of the common electrode 32 located on both sides of a hole H in the x-direction are electrically connected to each other.

With the arrangement of the holes H illustrated in FIG. 5, it is possible to maintain the state in which at least a part or the whole of each of the plurality of pixels is covered with the common electrode 32. Therefore, each hole H can be provided so as not to affect the uniformity of the transmittance of the light emitted from the light emitting layer 31. Further, in the example of FIG. 5, since several bridges Ha are provided in each of the plurality of regions each corresponding to a space between two pixels adjacent to each other in the x-direction, it is possible to prevent part of the common electrode 32 from becoming a floating conductor to which the ground potential is not supplied due to no electrical connection to any of one or more power supply lines.

As described above, the touch sensor 2 according to the present embodiment realizes the reduction of the area of the common electrode 32 constituting most of one of the electrodes of the vertical-direction capacitance, thereby reducing the vertical-direction parasitic capacitance itself. Therefore, even if the distance $d_2$ cannot be increased, it is possible to prevent the accuracy of the position detection by the sensor controller 52 from deteriorating due to the display driving signal. Further, it is possible to provide each hole H so as not to affect the uniformity of the transmittance of the light emitted from the light emitting layer 31, and also prevent part of the common electrode 32 from becoming a floating conductor to which the ground potential is not supplied.

Note that the positions of the holes H provided in the common electrode 32 are not limited to those illustrated in FIGS. 4A and 5. Although the holes H are arranged with regularity in the example of FIGS. 4A and 5, the holes H may be, for example, randomly arranged. For example, assume that the holes H are randomly arranged. In this case, it is preferable to arrange the holes H such that the number (or total area or total extension) of holes H each arranged between two adjacent pixels corresponding to one color combination of two adjacent pixels is substantially the same among different color combinations.

As an example, it is preferable to arrange the holes H such that the total number T1 of holes H each arranged between a pixel corresponding to red and a pixel corresponding to green, the total number T2 of holes H each arranged between a pixel corresponding to green and a pixel corresponding to blue, and the total number T3 of holes H each arranged between a pixel corresponding to blue and a pixel corresponding to red have substantially the same value. The "substantially the same value" here means that the maximum value of the absolute value of the difference between any two numbers of T1, T2, and T3 is smaller than 50% of one third of the sum total of T1, T2, and T3. This configuration makes it possible to suppress the color difference (color unevenness) between regions.

Figure 6:
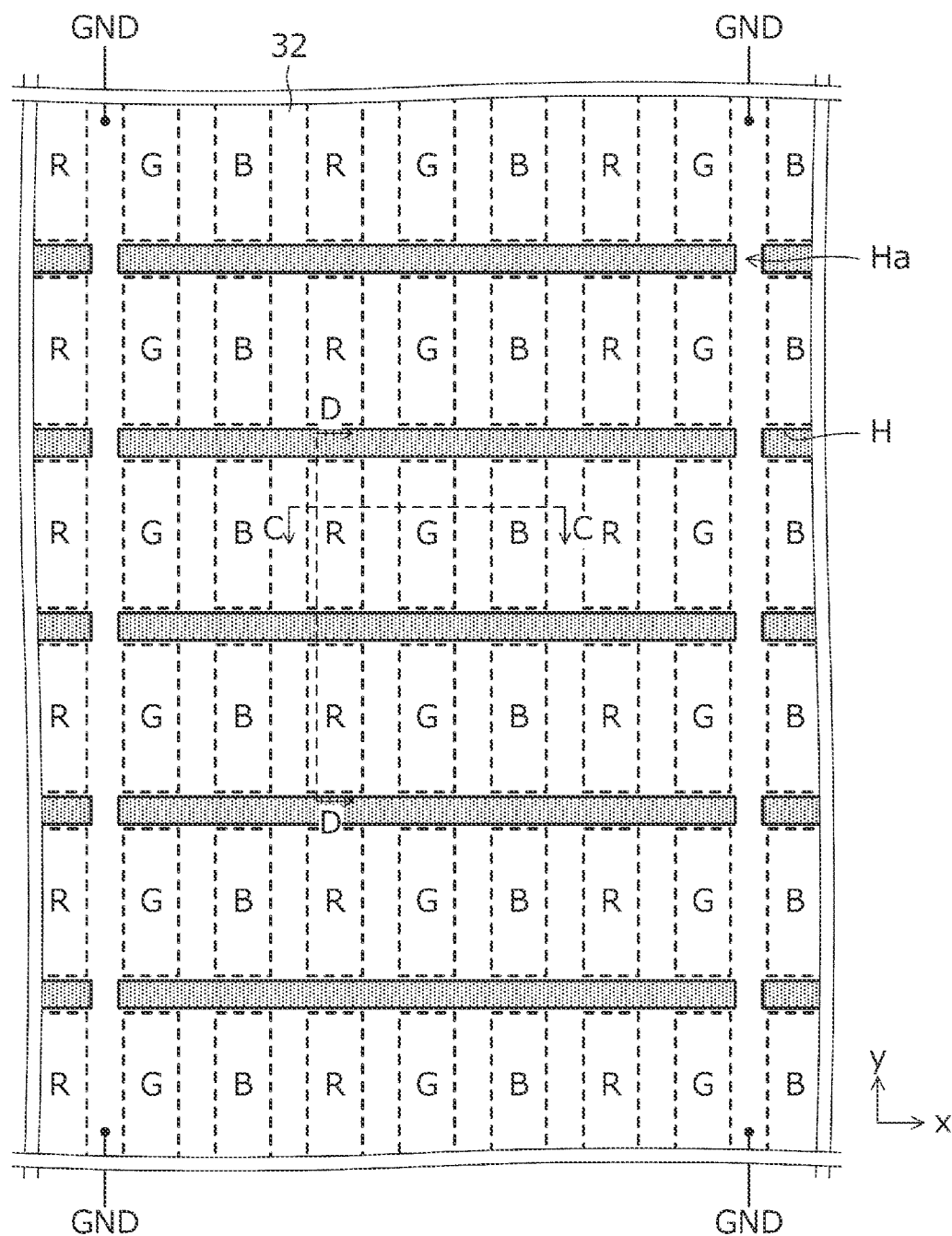
FIG. 6 is a view illustrating a planar configuration of the common electrode according to a first modification of the first embodiment of the present disclosure.
Figure 7A:
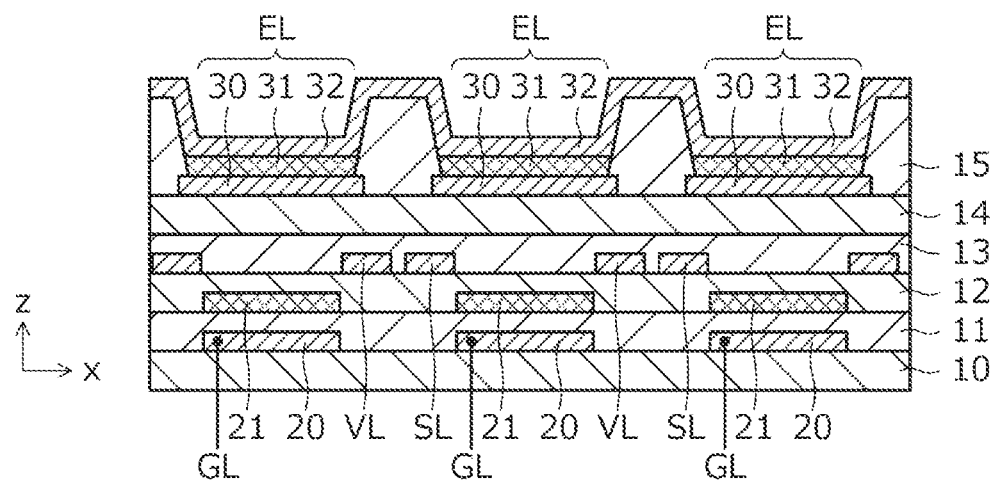
Figure 7B:
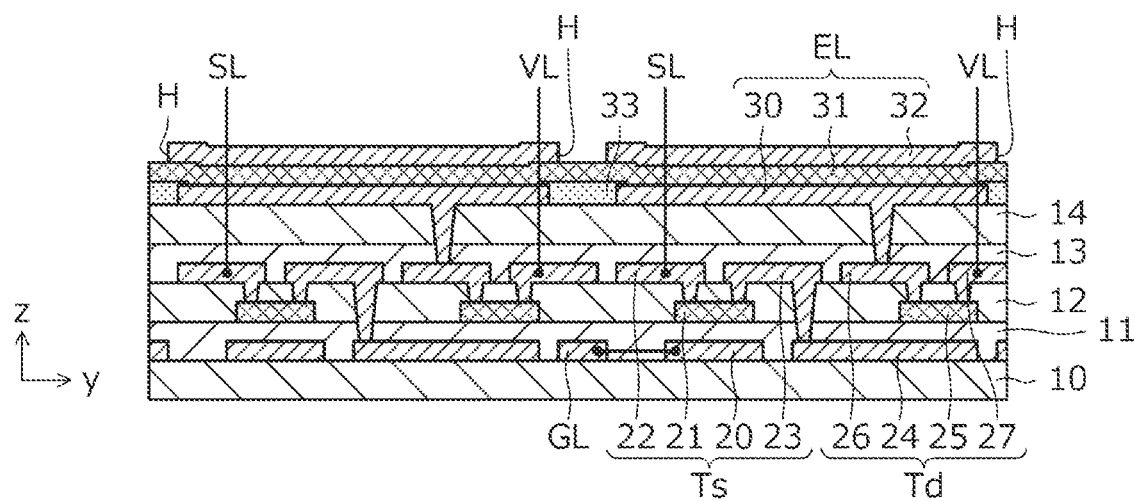
FIG. 7B is a cross-sectional view of the display panel taken along line D-D illustrated in FIG. 6.

FIG. 6 is a view illustrating a planar configuration of the common electrode 32 according to a first modification of the present embodiment. FIG. 7A is a cross-sectional view of the display panel 4 taken along line C-C illustrated in FIG. 6. FIG. 7B is a cross-sectional view of the display panel 4 taken along line D-D illustrated in FIG. 6. The present modification is different from the example illustrated in FIG. 5 in that each hole H extending in the x-direction is provided in a corresponding one of the plurality of regions each corresponding to a space between two pixels adjacent to each other in the y-direction. This modification is similar to the example illustrated in FIG. 5 in that several bridges Ha are provided in each of the plurality of regions each corresponding to a space between two pixels adjacent to each other in the y-direction. Further, power supply lines for supplying the ground potential GND to the common electrode 32 are provided. More specifically, two power supply lines are provided at one end of the display panel 4 in the y-direction, and two power supply lines are provided at the other end thereof.

With the present modification as well, it is possible to maintain the state in which at least a part or the whole of each of the plurality of pixels is covered with the common electrode 32. Therefore, each hole H can be provided so as not to affect the uniformity of the transmittance of the light emitted from the light emitting layer 31. Further, in the example of FIG. 5, since several bridges Ha are provided in each of the plurality of regions each corresponding to a space between two pixels adjacent to each other in the y-direction, it is possible to prevent part of the common electrode 32 from becoming a floating conductor to which the ground potential is not supplied.

Figure 8:
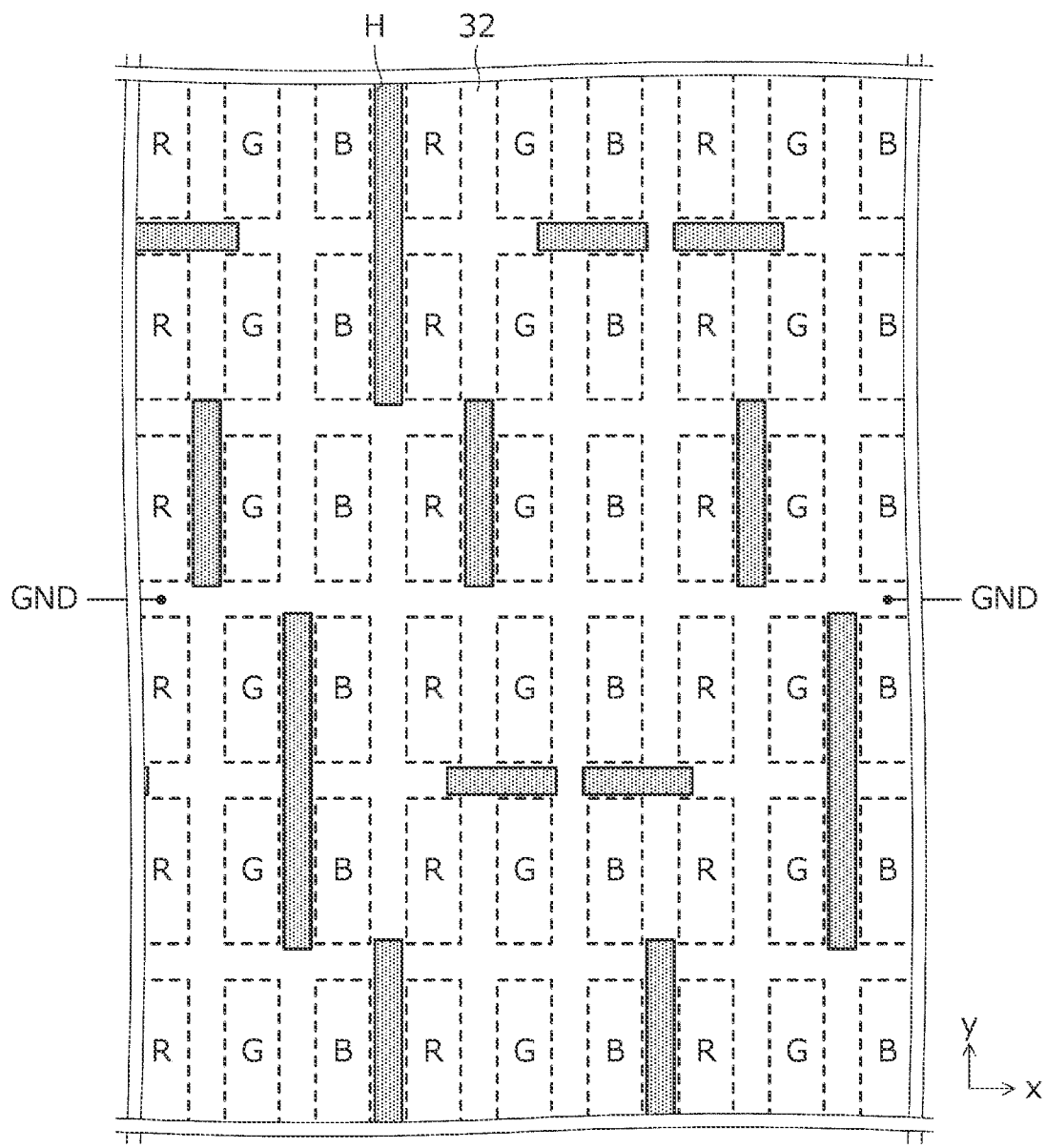
FIG. 8 is a view illustrating a planar configuration of the common electrode according to a second modification of the first embodiment of the present disclosure.

FIG. 8 is a view illustrating a planar configuration of the common electrode 32 according to a second modification of the present embodiment. In this example, the holes H are arranged randomly or with regularity in some of the regions each corresponding to a space between two pixels adjacent to each other in the x-direction and some of the regions each corresponding to a space between two pixels adjacent to each other in the y-direction. However, in order to prevent part of the common electrode 32 from becoming a floating conductor to which the ground potential is not supplied, the size and position of each hole H are adjusted so as not to generate a portion entirely surrounded by the hole H. With this example as well, it is possible to provide each hole H so as not to affect the uniformity of the transmittance of the light emitted from the light emitting layer 31, and also prevent part of the common electrode 32 from becoming a floating conductor to which the ground potential is not supplied.

Figure 9:
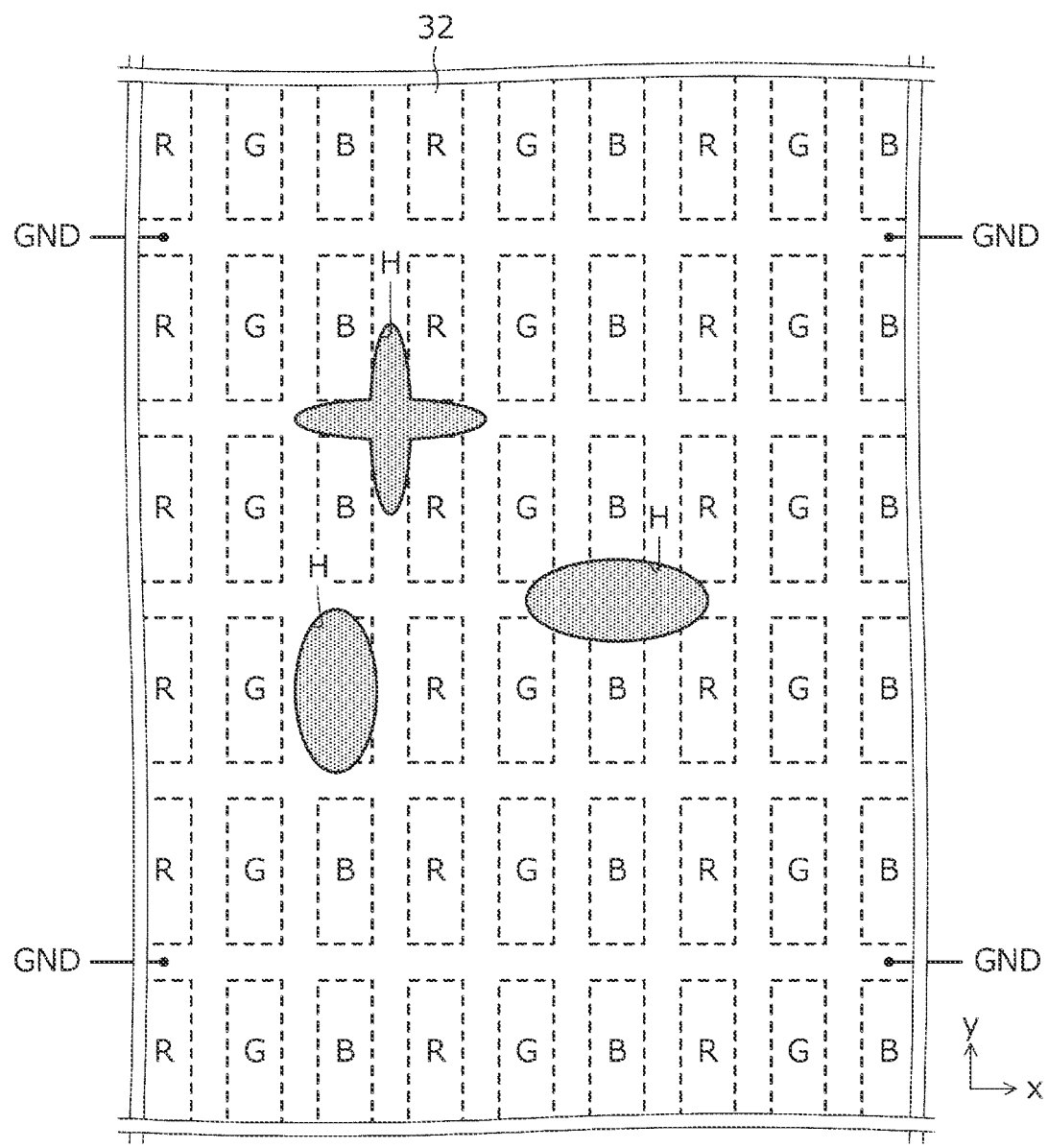
FIG. 9 is a view illustrating a planar configuration of the common electrode according to a third modification of the first embodiment of the present disclosure.

FIG. 9 is a view illustrating a planar configuration of the common electrode 32 according to a third modification of the present embodiment. In this example, the holes H are provided to substantially entirely cover some of the pixels. If the hole H has almost no effect on the uniformity of the transmittance of the light emitted from the light emitting layer 31, the holes H can be provided to substantially entirely cover some of the pixels in this way.

Figure 10:
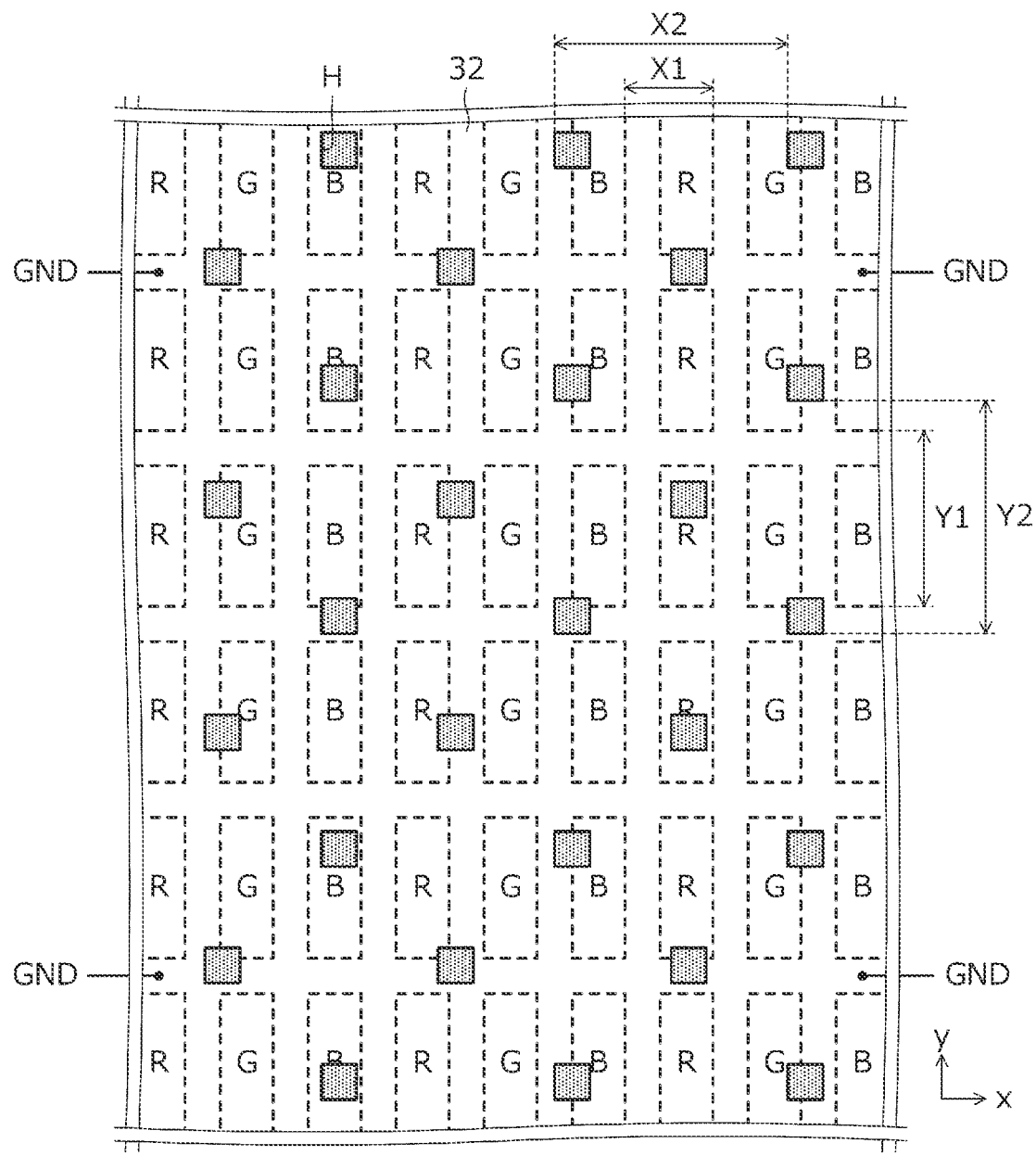
FIG. 10 is a view illustrating a planar configuration of the common electrode according to a fourth modification of the first embodiment of the present disclosure.

FIG. 10 is a view illustrating a planar configuration of the common electrode 32 according to a fourth modification of the present embodiment. The present modification is an example of the case where the holes H need to be formed in the common electrode 32 independently of the arrangement of the pixels, such as the case where the holes H are made in the common electrode 32 after the completion of the display panel 4. In this case, in order to avoid an effect of the holes H on the image quality as much as possible, it is preferable that each hole H be formed to have an area smaller than the area of a pixel, as illustrated in FIG. 10. Further, it is preferable to regularly arrange the holes H as illustrated in FIG. 10 such that the holes H are uniformly arranged for each of red, green, and blue. Further, in order to prevent moire from occurring, it is preferable to provide the holes H such that an x-direction pitch X2 of the regularly arranged holes H is not a multiple or a divisor of an x-direction pitch X1 of the pixels and such that a y-direction pitch Y2 of the regularly arranged holes H is not a multiple or a divisor of a y-direction pitch Y1 of the pixels.

Figure 11:
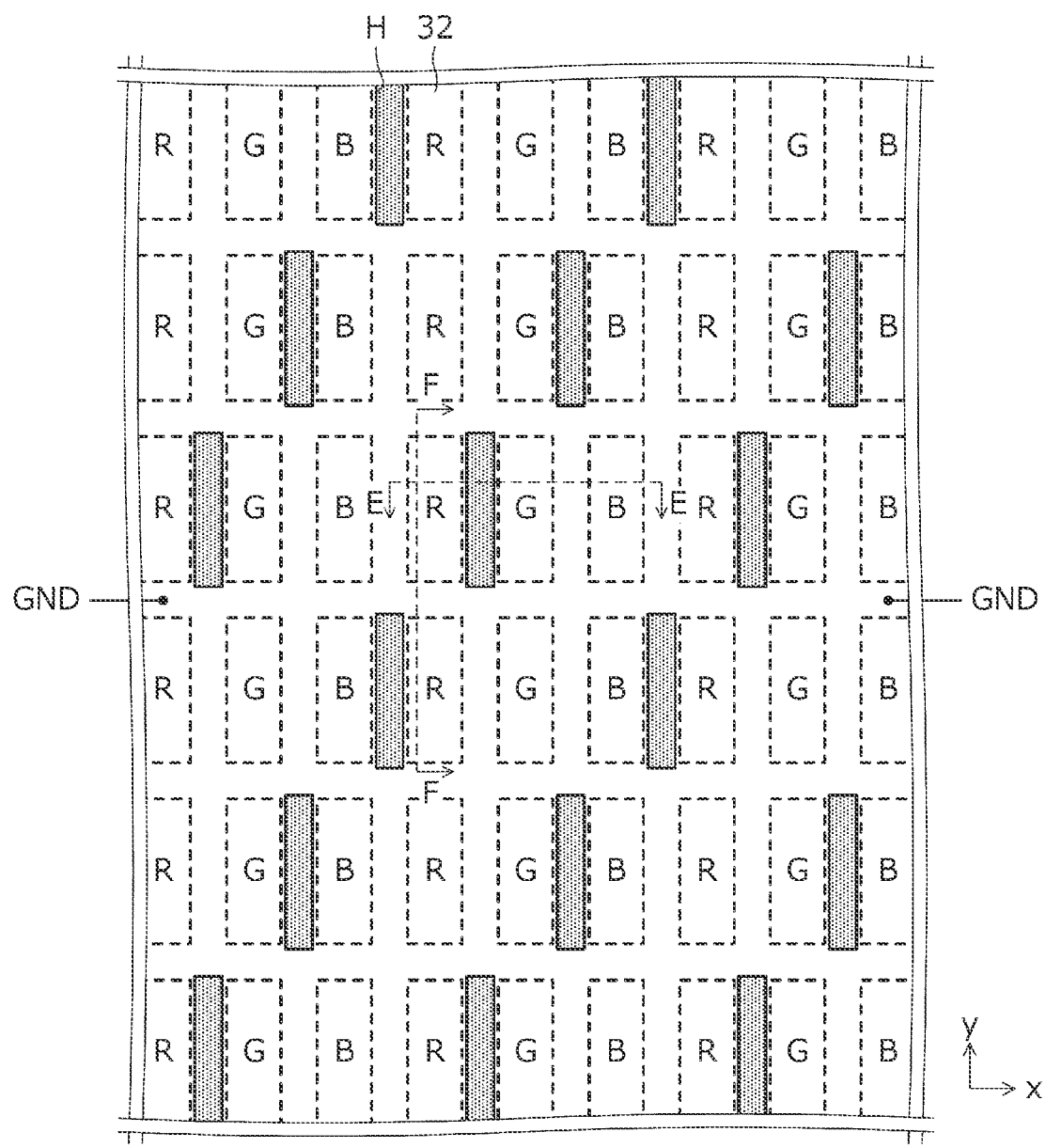
FIG. 11 is a view illustrating a planar configuration of the common electrode included in the touch sensor according to a second embodiment of the present disclosure.
Figure 12A:
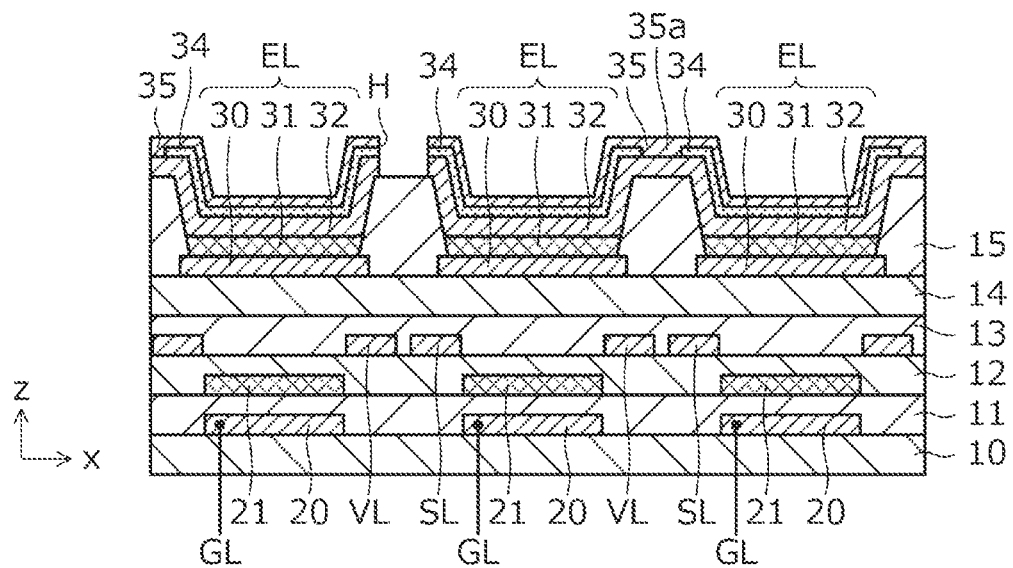
Figure 12B:
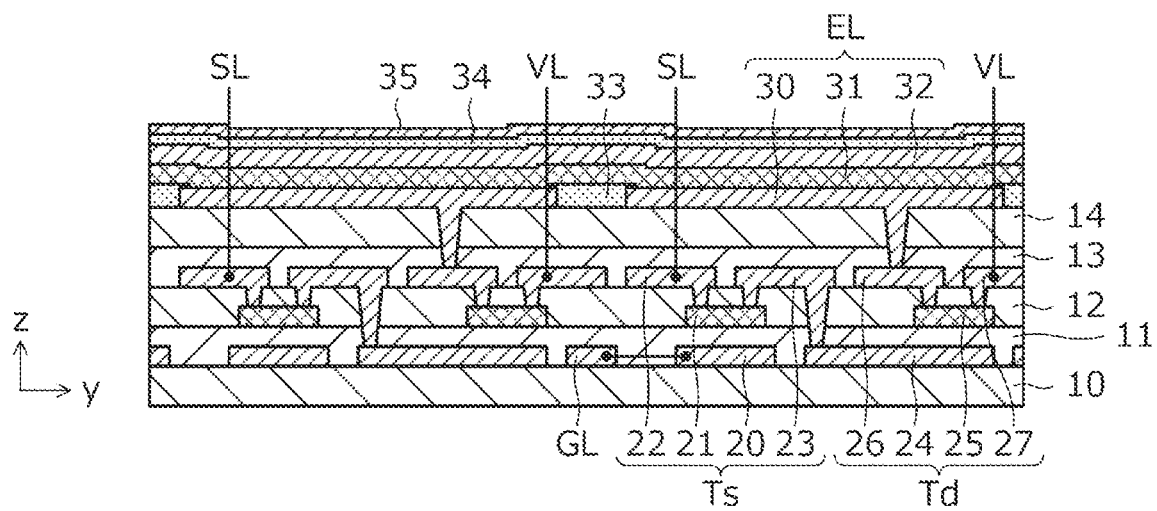
FIG. 12B is a cross-sectional view of the display panel taken along line F-F illustrated in FIG. 11.

FIG. 11 is a view illustrating a planar configuration of the common electrode 32 included in the touch sensor 2 according to a second embodiment of the present disclosure. FIG. 12A is a cross-sectional view of the display panel 4 taken along line E-E illustrated in FIG. 11. FIG. 12B is a cross-sectional view of the display panel 4 taken along line F-F illustrated in FIG. 11. The touch sensor 2 according to the present embodiment is different from the touch sensor 2 according to the first embodiment in that the display panel 4 includes one or more auxiliary electrodes 35 (hereinafter collectively referred to as the "auxiliary electrode 35"). Hereinafter, the structure of the display panel 4 according to the present embodiment will be described in detail, focusing on the differences from the touch sensor 2 according to the first embodiment.

The auxiliary electrode 35 is a transparent conductor provided for reducing the resistance of the common electrode 32. As illustrated in FIGS. 12A and 12B, the auxiliary electrode 35 is formed on the upper surface of the common electrode 32 with a protective layer 34 interposed therebetween. The protective layer 34 is a transparent insulator. The auxiliary electrode 35 and the common electrode 32 are connected to each other at positions above the insulating layer 15 by one or more via conductors 35a which penetrate the protective layer 34. Addition of the auxiliary electrode 35 helps reducing the resistance of the common electrode 32 but increases the vertical-direction parasitic capacitance compared to the case where the auxiliary electrode 35 is not provided.

As illustrated in FIG. 12A, each hole H according to the present embodiment is formed to penetrate the auxiliary electrode 35, the protective layer 34, and the common electrode 32. Therefore, neither the common electrode 32 nor the auxiliary electrode 35 is provided at the positions where one or more holes H are provided as viewed in the horizontal direction.

In order to prevent the generation of a portion that becomes a floating conductor in the auxiliary electrode 35 due to no supply of the ground potential to the auxiliary electrode 35, one or more holes H according to the present embodiment are formed to leave via conductors 35a intact, at least to the extent that a portion that becomes a floating conductor is not generated in the auxiliary electrode 35. The arrangement of the holes H illustrated in FIG. 11 is an example of such an arrangement of the holes H. In the example of FIG. 11, the holes H are arranged such that a row in which a hole H is arranged between a pixel corresponding to red and a pixel corresponding to green, a row in which a hole H is arranged between a pixel corresponding to green and a pixel corresponding to blue, and a row in which a hole H is arranged between a pixel corresponding to blue and a pixel corresponding to red are repeatedly arranged in order from one end side of the display panel 4 in the y-direction. This arrangement can prevent the auxiliary electrode 35 from having a portion that becomes a floating conductor.

As described above, the touch sensor 2 according to the present embodiment realizes the reduction of the area of the common electrode 32 and the auxiliary electrode 35, which together constitute most of one of the electrodes of the vertical-direction capacitance. Accordingly, even when the auxiliary electrode 35 is provided in the display panel 4, it is possible to reduce the vertical-direction parasitic capacitance itself. Therefore, even if the distance $d_2$ illustrated in FIG. 1 cannot be increased, it is possible to prevent the accuracy of the position detection by the sensor controller 52 from deteriorating due to the display driving signal.

Further, the touch sensor 2 according to the present embodiment can maintain the electrical connection between the auxiliary electrode 35 and the common electrode 32. Therefore, it is possible to prevent not only the common electrode 32 but also the auxiliary electrode 35 from having a portion that becomes a floating conductor due to no supply of the ground potential. Moreover, since the holes H are uniformly arranged for each of red, green, and blue, it is possible to suppress the color difference (color unevenness) between regions.

Figure 13:
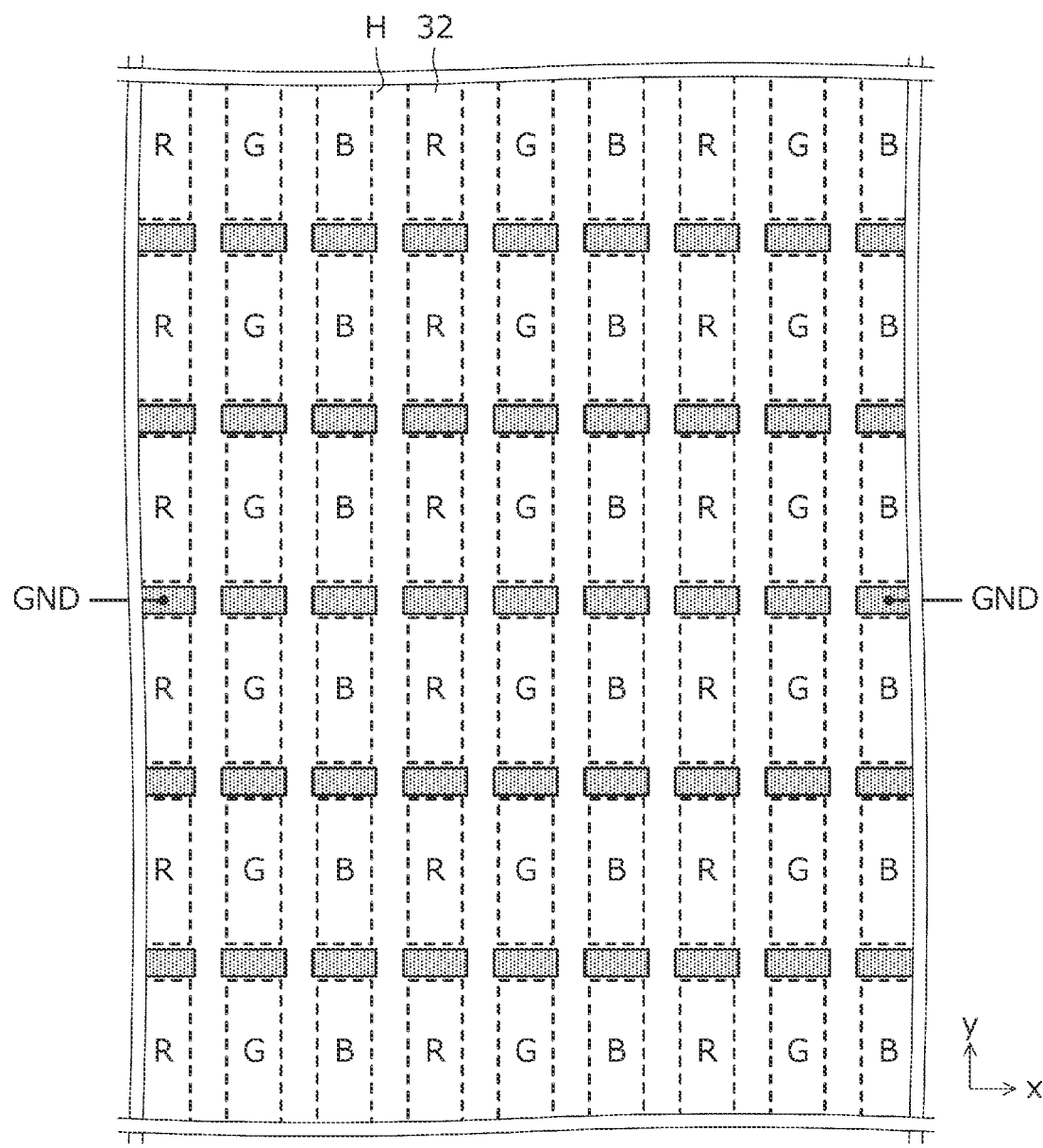
FIG. 13 is a view illustrating a planar configuration of the common electrode according to a first modification of the second embodiment of the present disclosure.

FIG. 13 is a view illustrating a planar configuration of the common electrode 32 according to a first modification of the present embodiment. In the present modification, each hole H having a width in the x-direction substantially equal to that of a pixel is provided between two pixels adjacent to each other in the y-direction. With this arrangement, it is possible to uniformly arrange the holes H for each of the three colors while leaving all the via conductors 35a. Therefore, it is possible to suppress the color difference (color unevenness) between regions while preventing the auxiliary electrode 35 from having a portion that becomes a floating conductor.

Figure 14:
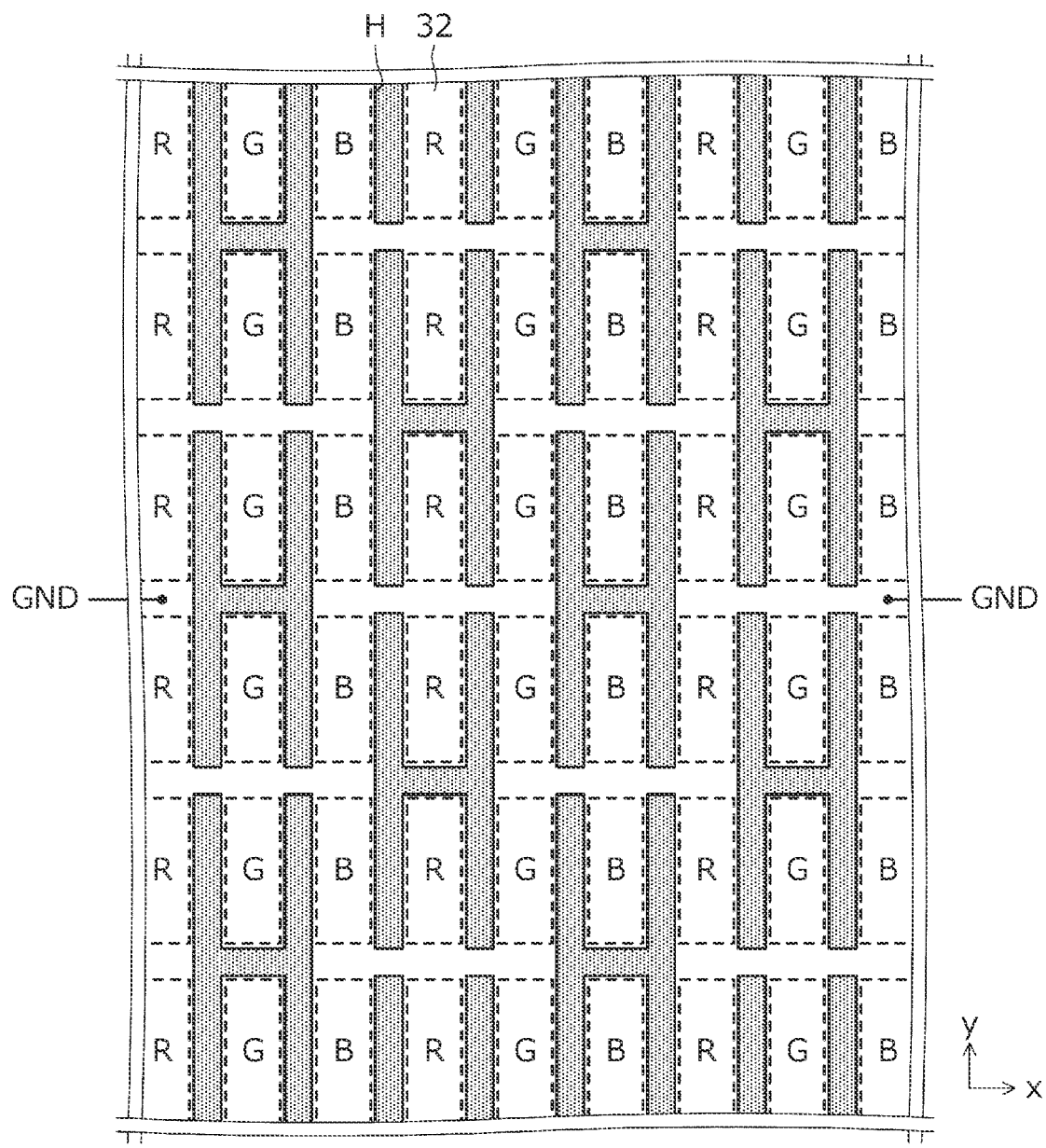
FIG. 14 is a view illustrating a planar configuration of the common electrode according to a second modification of the second embodiment of the present disclosure.

FIG. 14 is a view illustrating a planar configuration of the common electrode 32 according to a second modification of the present embodiment. In the present modification, H-shaped holes H are each formed by using a region between two pixels adjacent to each other in the y-direction and regions on both sides of these two pixels. The H-shaped holes H are arranged side by side in the y-direction. Further, each H-shaped hole H is positioned every other column as viewed in the x-direction. Further, in the columns of two H-shaped holes H adjacent to each other in the x-direction, the positions of the holes H are displaced from each other by one pixel. With the configuration described above, in the present modification as well, it is possible to suppress the color difference (color unevenness) between regions while preventing the auxiliary electrode 35 from having a portion that becomes a floating conductor.

Although the embodiments of the present disclosure have been described above, the present disclosure is by no means limited to the above-described embodiments. As a matter of course, the present disclosure can be implemented in various modes without departing from the scope of the present disclosure.

For example, although the disclosure is made using an example in which the touch sensor 2 includes the display panel 4, which is an organic EL display, in each of the above-described embodiments, the present disclosure may also be applied to the touch sensor 2 including the display panel 4 of a different type. For example, when the display panel 4 is a liquid crystal display as an example, each of the plurality of pixels includes a material (specifically, a liquid crystal layer) that controls the passage of light according to the potential difference between the corresponding pixel electrode and the common electrode. Further, the holes H are formed to maintain the state in which at least part of each of the plurality of pixels is covered with the common electrode. With this arrangement, as with each of the above-described embodiments, even if the distance $d_2$ cannot be increased, it is possible to prevent the accuracy of the position detection by the sensor controller 52 from deteriorating due to the display driving signal. Further, it is possible to provide each hole H so as not to affect the uniformity of the transmittance of the light emitted from the light emitting layer 31, and also prevent part of the common electrode 32 from becoming a floating conductor to which the ground potential is not supplied.

Further, although the disclosure is made using an example of the touch sensor 2 of the on-cell type in each of the above-described embodiments, the present disclosure can similarly be applied to a touch sensor of the out-cell type.

Further, although the disclosure is made using an example in which the auxiliary electrode 35 is formed on the upper side of the common electrode 32 in the second embodiment described above, the present disclosure can also be applied to the case where the auxiliary electrode is formed on the lower side of the pixel electrode 30. In this case, as with the second embodiment, each hole H is preferably formed to penetrate the common electrode 32 while via conductors connecting the common electrode 32 and the auxiliary electrode are left intact to the extent that a floating conductor is not generated in the auxiliary electrode. In this case, it is not always necessary to form each hole H to penetrate the auxiliary electrode, but each hole H may be formed to penetrate the auxiliary electrode as well.

Further, although the disclosure is made using an example in which each hole H is used as the conductor-area-reduction portion in each of the embodiments described above, the area of the common electrode 32 (and the auxiliary electrode) may be reduced by another mechanism. For example, the conductor-area-reduction portion may be formed by increasing the resistance of part of the common electrode 32 (and the auxiliary electrode) by ion implantation of impurities.

The invention claimed is:

1. A touch sensor, comprising:
a display panel that includes a plurality of pixel electrodes each provided in a corresponding one of a plurality of pixels, and a common electrode shared by the plurality of pixels; and
a touch panel that detects a position of at least either a finger or a pen,
wherein the display panel and the touch panel are superimposed on each other in a vertical direction perpendicular to the display panel, and
the common electrode includes a conductor-area-reduction portion that reduces an area of the common electrode, wherein,
the conductor-area-reduction portion consists of all of a plurality of holes formed in the common electrode;
the plurality of holes collectively function as the conductor-area-reduction portion;
the plurality of holes are arranged at a hole pitch HP in a first direction, the plurality of pixels are arranged at a pixel pitch PP in the first direction, the hole pitch HP is not a multiple of the pixel pitch PP, and the hole pitch HP is not a divisor of the pixel pitch PP.

2. The touch sensor according to claim 1, wherein the plurality of holes are formed such that the common electrode which remains after the formation of the plurality of holes therein covers at least a part of each of the plurality of pixel electrodes as viewed in the vertical direction.

3. The touch sensor according to claim 2, wherein each of the plurality of holes is formed in a region corresponding to a space between two or more of the plurality of pixel electrodes as viewed in a horizontal direction.

4. The touch sensor according to claim 1,
wherein the common electrode is connected to a constant voltage power supply by one or more power supply lines, and
the plurality of holes are formed such that all portions of the common electrode, which remain after the formation of the plurality of holes, are electrically connected to the one or more power supply lines.

5. The touch sensor according to claim 1,
wherein the display panel further includes one or more auxiliary electrodes each provided at a position facing the common electrode in the vertical direction and each electrically connected to the common electrode by one or more via conductors, and
the one or more auxiliary electrodes are not provided at positions where the plurality of holes are provided as viewed in a horizontal direction.

6. The touch sensor according to claim 1, wherein the plurality of holes are each formed to have an area smaller than an area of each of the plurality of pixels.

7. The touch sensor according to claim 1, wherein each of the plurality of pixels includes a material that emits light according to a potential difference between a corresponding one of the pixel electrodes and the common electrode.

8. The touch sensor according to claim 1, wherein each of the plurality of pixels includes a material that controls passage of light according to a potential difference between a corresponding one of the pixel electrodes and the common electrode.

9. The touch sensor according to claim 1, wherein the first direction is one of two directions which are perpendicular to each other and which are both parallel to the display panel.

* * * * *